United States Patent [19] [11] 3,803,508
Shaw [45] Apr. 9, 1974

[54] PULSED AMPLIFIER FOR HIGH FREQUENCY ENERGY

[75] Inventor: Melvin P. Shaw, Southfield, Mich.
[73] Assignee: Energy Conversion Devices, Inc., Troy, Mich.

[22] Filed: Oct. 4, 1971
[21] Appl. No.: 186,158

[52] U.S. Cl. .................... 331/58, 330/34
[51] Int. Cl. .................... H03b 27/00
[58] Field of Search .......... 307/258; 330/34; 331/58, 331/115, 111, 113

[56] References Cited

UNITED STATES PATENTS

| | | | |
|---|---|---|---|
| 3,267,294 | 8/1966 | Dumke et al. | 307/258 |
| 3,376,433 | 4/1968 | Robbins | 307/258 X |
| 3,680,054 | 7/1972 | Yamashifa | 331/115 X |
| 2,866,162 | 12/1958 | Rosen et al. | 331/58 X |
| 3,271,591 | 9/1966 | Ovshinsky | 307/258 |
| 3,100,849 | 8/1963 | Hollander, Jr. | 330/34 X |

*Primary Examiner*—Nathan Kaufman
*Attorney, Agent, or Firm*—Wallenstein, Spangenberg, Hattis & Strampel

[57] ABSTRACT

A pulsed amplifier for microwave or higher frequency energy comprising a circuit device having a body of substantially amorphous semiconductor material exhibiting a negative differential conductivity and having spaced electrodes thereon, the circuit device being biased to operate in a relaxation oscillation mode wherein reflection amplified output pulses of high energy level are produced at a pulse repetition rate equal to the rate at which the oscillator traverses the negative differential conductivity region. A modified microwave strip transmission line is employed as the input-output transmission medium.

7 Claims, 7 Drawing Figures

INVENTOR.
Melvin P. Shaw
BY
Barnard, McGlynn & Reising
ATTORNEYS.

INVENTOR.
Melvin P. Shaw
BY
Barnard, McGlynn & Reising
ATTORNEYS

PULSED AMPLIFIER FOR HIGH FREQUENCY ENERGY

This invention relates to electrical amplifiers and more particularly to a microwave frequency, amplifier comprising a relaxation oscillator circuit, including a control device of amorphous, semiconductor material.

Electrical circuit devices such as diodes and transistors are typically constructed with polarized crystalline semiconductor materials; that is, materials having an ordered atomic structure which is doped with impurities to produce a free charge carrier population. Moreover, such devices necessarily include at least one electrically controlled junction defined by the interface between the layers of oppositely polarized materials.

More recently, it has been found that electrical control devices can be fabricated from amorphous or glassy materials having a noncrystalline or substantially disordered atomic structure, such materials being traditionally thought of as insulators. Devices of this type are described in the U.S. Pat. No. 3,271,591 granted on Sept. 6, 1966 to S. R. Ovshinsky, and include devices of two, three, and more terminals.

The amorphous, semiconductor devices described in the above-mentioned Ovshinsky patent typically exhibit a voltage-current characteristic having an abrupt, apparent discontinuity wherein the bulk resistivity of the device experiences a rapid decrease at a well defined threshold voltage value. This resistivity switching effect may be such as to require a holding current to maintain the low resistance state or it may be self sustaining but reversible; devices of the first type being hereinafter referred to as "threshold" devices so as to be distinguished from devices of the second type which are commonly referred to as "memory" devices.

According to the present invention, a threshold device preferably formed by a body of amorphous, semiconductor material may be operated in a self-sustained, oscillatory mode to provide an amplifier for high frequency electromagnetic energy, which amplifier is capable of producing sharply defined, short duration output pulses of such energy at readily controllable rates. In general, the amplifier of the present invention contemplates the generation of electromagnetic energy pulses in the microwave and higher frequency ranges at pulse repetition rates which are relatively low and of pulse durations which are extremely short.

This is accomplished through the use of an electronic circuit or current control device of the "threshold" type and preferably comprising a body of amorphous, generally glassy, material. In addition, the circuit device is biased to operate in a relaxation oscillator mode. In this mode, the device repeatedly traverses a region of negative differential conductivity during an extremely short time span. During this traversal, the device operates to amplify an input energy waveform to produce an output pulse train at a pulse repetition rate equal to the rate at which the device experiences the repeated traversals of the negative differential conductance region.

By way of theoretical analysis, it is believed that the negative differential conductivity of the preferred amorphous threshold device from which the subject amplifier is implemented produces the phenomenon of current filament formation in the semiconductors body at certain applied voltage thresholds. During the formation of the filaments, the device exhibits a region of rapidly decreasing voltage with increasing current. When biased with suitable applied voltage and resistive load, the dc load line may be made to cross the conduction current characteristic of the device in the negative differential conductivity region, giving rise to an operating instability. In such a threshold filament-forming device, this instability may be such as to cause the current through the semiconductor body to cycle between the threshold of high-to-low resistivity switching previously described thus, giving rise to alternate filament formation and quenching, the sequence being repeated and self-sustaining. This is, of course, a relaxation oscillation for such a device. While traversing the negative differential conductivity region during each relaxation oscillation, the amorphous, semiconductor body responds to a high frequency input waveform to produce output pulses at the same frequency as the input waveform but at a higher power level; thus, giving rise to gain in a pulsed mode. The frequency of the input waveform, measured in a continuous wave fashion, must be higher than the inverse of the filament formation time for amplification to result.

In the preferred embodiment, an amplifier for high frequency electromagnetic energy waveforms is provided by the combination of a threshold device comprising a body of amorphous semiconductor material such as a chalcogenide glass exhibiting a negative differential conductivity characteristic and having opposed terminals deposited thereon. The threshold device is connected by way of the deposited terminals in a load circuit including a voltage source and a load to operate in a relaxation oscillator mode. Each relaxation oscillation of the threshold device involves an excursion through a region of negative differential conductivity wherein the body is capable of electromagnetic wave amplification. This waveform amplification is sometimes referred to as "reflection amplification" and although this terminology may be helpful in orienting those skilled in the art with respect to the present invention the term "reflection" is not to be construed as indicating in any way the directionality of sensitivity or the directionality of the input and output waveforms as will become more apparent in the following description. The threshold device is combined with electromagnetic energy transmission means, such as a microwave strip transmission line, to provide for the impingement of an input waveform in the microwave frequency range on the amorphous body. Moreover, the microwave strip transmission line or such other wave transmission means as employed affords an output signal path for the transmission of the pulses of high-frequency electromagnetic energy which are produced by the amorphous body in the reflection amplification operation. As is believed to be apparent from the foregoing, the repetition rate of these pulses is the oscillation rate of the threshold device and may be controlled within predetermined limits by the applied voltage of the load circuit. It has been theoretically determined that pulses having a duration on the order of 100 picoseconds may be produced by the threshold device implemented as indicated above. The amplifier of the invention may find application in radar systems and other systems in which a very short duration pulse of high-frequency energy is desired.

The various features and advantages of the subject invention will become more apparent from a reading of the following specification which is to be taken in conjunction with the accompanying drawings in which.

Figure 1:
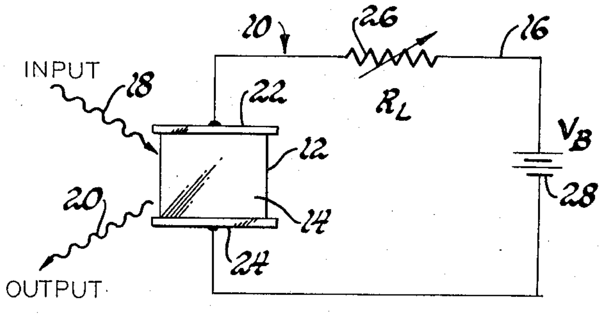
FIG. 1 is a schematic diagram of a pulsed amplifier embodying the invention.
Figure 2:
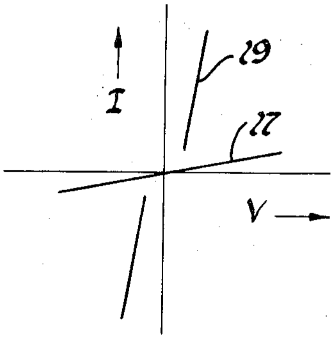
FIG. 2 is a diagram of the current-voltage relationship for a typical amorphous semiconductor material forming the threshold device used in the present invention.

Referring to FIG. 1, there is shown in schematic circuit diagram form an amplifier 10 for high-frequency electromagnetic energy comprising a threshold device 12 made up of a body 14 of substantially amorphous semiconductor material of the type having a current-voltage relationship as illustrated in FIG. 2. The threshold device 12 is connected into a circuit 16 for biasing the device 12 into a self-sustaining relaxation oscillation mode wherein current filaments in the body 14 are alternately formed and quenched at a predetermined repetition rate.

The body 14 of amorphous, filament-forming, semiconductor material may be constructed from various glassy materials including chalcogenide glasses of the type set forth in the aforementioned Ovshinsky U.S. Pat. No. 3,271,591. Other suitable threshold materials are set forth in the pending application United States Application Ser. No. 161,219, filed July 9, 1971, this application being a Continuation-In-Part of application United States Application Ser. No. 63,404, filed Aug. 13, 1970. Such amorphous semiconductors materials exhibit the apparently discontinuous current-voltage relationship which is illustrated in FIG. 2 as comprising a substantially ohmic high-resistance portion 17 and a low-resistance portion 19. A rapid, switching transistion between the high-resistance condition illustrated by portion 17 and the low-resistance condition illustrated by portion 19 is experienced by the amorphous material at a threshold current value as indicated by the abrupt, discontinuity between the curve portions. From FIG. 2 it is apparent that the material which is characterized there is a "threshold" material as previously defined in that a holding current of a minimum or threshold value must be maintained to avoid the switching transition from the low-resistance condition back to the high-resistance condition represented by portion 17 of the curve. For purposes of this discussion, it will be assumed that a device, such as threshold device 12 of FIG. 1, having a body 14 of amorphous material exhibiting the current voltage switching characteristic of FIG. 2 may be referred to as an amorphous, filament-forming semiconductor device, the filament formation being a current filament or volume of high current density which occurs at a predetermined threshold voltage and which is rapidly quenched or dissipated when the voltage is reduced to the point that the threshold or minimum holding current value indicated by FIG. 2 is not met. Threshold device 12 has a body 14 of such a material.

Looking again to FIG. 1, the body 14 is provided with deposited contacts or terminal electrodes 22 and 24 on opposite, parallel, and spaced surfaces thereof to facilitate the interconnection with circuit 16. Circuit 16 includes a variable load resistor 26 and a dc source 28. As previously indicated, the circuit 16 establishes a dc load line which gives rise to a self-sustaining oscillatory condition whereby the circuit device 12 experiences repeating transitions between the high and low resistance states; thus, the circuit 16 functions in a relaxation oscillation mode wherein current filaments through the amorphous body 14 are alternately formed and quenched at a rate which is determined by the values of load resistor 26 and the dc source 28. In other words, the load line is such that permanent switching between the low and high resistance states does not occur. Electromagnetic energy transistion means are provided in accordance with the objectives of the invention whereby an input waveform 18 in the microwave frequency range or higher is caused to impinge upon the body 14 of amorphous material while the threshold device 12 and the exterior circuit elements are operating in the relaxation oscillator mode. As the body 14 traverses the negative differential conductivity region, hereinafter described in detail with reference to FIGS. 3 and 4, the body 14 operates in a reflection amplification fashion to produce a high-energy output waveform 20 composed of time-spaced pulses, each pulse having a continous wave frequency in the microwave frequency range, each pulse further exhibiting a substantially higher power level than that of the input waveform 18. The pulses occur at a repetition rate which is equal to that of the relaxation oscillation. Accordingly, circuit 16 of FIG. 1 produces short duration pulses or spikes of microwave frequency energy suitable for use in radar applications as well as other applications as will be apparent to those skilled in the art.

Figure 3:
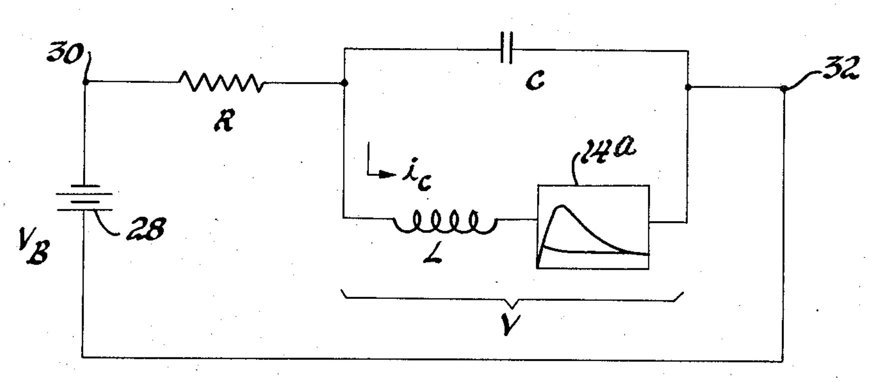
FIG. 3 is an equivalent circuit diagram for the amplifier circuit of the present invention.

Looking now to FIG. 3, an equivalent circuit diagram indicating the nonlinear component qualities of the circuit 16 of FIG. 1 is shown. As will be apparent to those skilled in the art, the threshold device 12 of FIG. 1 exhibits certain "packaging" qualities due to the presence of the spaced terminal electrodes 22 and 24, the hysteretic quality of the amorphous material of body 14, the resistance of the body 14, and the filament-forming quality or negative differential conductivity of the threshold-type amorphous semiconductor material. These characteristics permit the circuit 16 of FIG. 1 to be redrawn between points 30 and 32 of FIG. 3 to illustrate the primary circuit which is seen by the dc source 28. In FIG. 3, the load resistance of the circuit 26 illustrated by the resistor R, the capacitance introduced principally by the electrodes 22 and 24 is illustrated by the capacitor C, and the package and/or intrinsic inductance of the inductor L. The negative differential conductivity characteristic is illustrated schematically by the circuit element 14*a* having the current voltage curve sketched therein.

Figure 4:
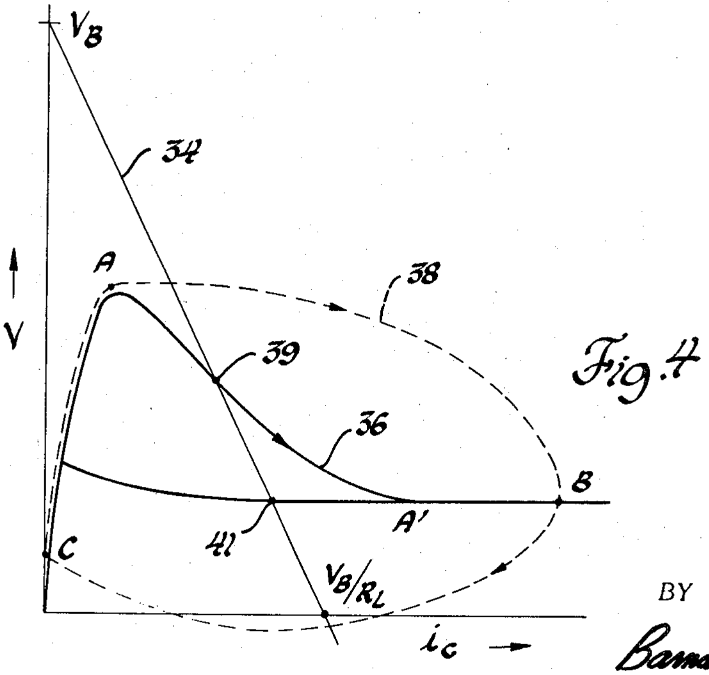
FIG. 4 shows the conduction current characteristic for threshold device together with the load line selection for an operating embodiment of the invention.

In analyzing the circuit of FIG. 3, it is assumed that the load resistor 26 establishes a dc load line 34 as shown in FIG. 4 which crosses the V-$i_c$ characteristic curve 36 of FIG. 4 in the negative differential conductivity region. For purposes of discussion, the current through the element 14*a* of FIG. 3 is referred to hereinafter as the "conduction current" of circuit device 12 and is used in the abscissa of the curves of FIG. 4.

When, as illustrated in FIG. 4, the internal and external component values of the equivalent circuit illustrated in FIG. 2 are such that the dc load line 34 intersects the voltage-conduction current characteristic curve 36 of the circuit 16 at point 39 which lies in the negative differential conductivity region, an inherent instability is produced in the threshold switching material such that current filaments can be alternately formed and quenched in the amorphous body 14. Load line 34 also crosses characteristic curve 36 at a stable point 41 when the device 12 is in the filamentary condition. This load line relationship gives rise to a substantially eliptical voltage-conduction current Lissajou characteristic 38 wherein the excursion through the negative differential conductivity region is represented generally by the portion of the ellipse 38 between points A and A'. The excursion along ellipse 38 is generally clockwise and includes a rapid conduction current rise between points A and B, a decrease between points B and C and a slow buildup along the low field resistance portion of the $i_c$ curve between points C and A. It has been found that the critical relationship for relaxation oscillation in the filament-forming negative differential conductivity device 12 of FIG. 1 is met when the following expression is at least approximately satisfied:

$$\sqrt{LC}/R_0C = 1/2,$$

where $R_0$ is the low current resistance (i.e., high resistance of the voltage current curve 29.

Figure 5:
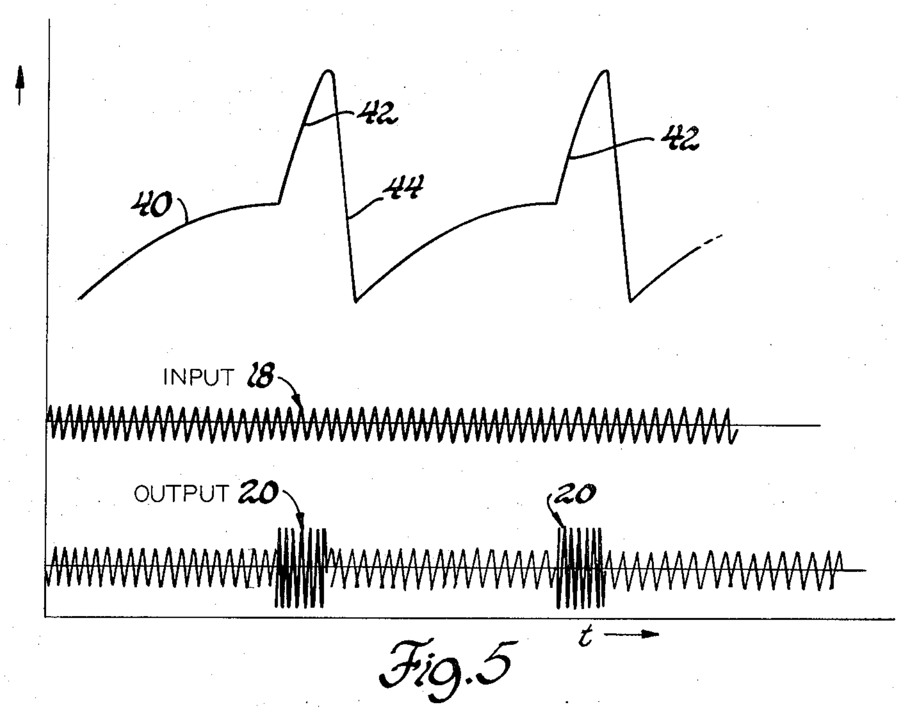
FIG. 5 is a waveform diagram indicating the character of the current transitions, input waveform, and output waveform in the amplifier of the subject invention with respect to time.

Looking now to FIGS. 1 and 5, the object of the relaxation oscillation mode of operation is to cause repeated excursions of the threshold device 12 through the negative differential conductivity region of between points A and B of FIG. 4 so as to produce an amplified output waveform portions 20 at the same continuous wave frequency as the input waveform 18 but at a higher power level and for an extremely short duration. The time-varying conduction current characteristic and also the character of the output waveform 20 is illustrated in FIG. 5. In that FIGURE the curve 40 represents the variation in the conduction current through terminals 22 and 24 as a function of time. As can be seen in FIG. 5, the conduction current builds relatively slowly along a relatively exponential path and then increases rapidly to form a current spike 42. Once the current spike 42 reaches a maximum value, the current drops off quickly along line 44 and the waveform is thereafter repeated. The steep increasing portion 42 of curve 40 represents the portion of the eliptical curve 38 between points A and B in FIG. 4 and also represents the duration of the output waveform 20 illustrated in FIG. 1. The time interval between the current spikes is, of course, the pulse repetition rate of the output signal. It has been found that output pulse durations on the order of 100 picoseconds may be achieved.

Figure 6:
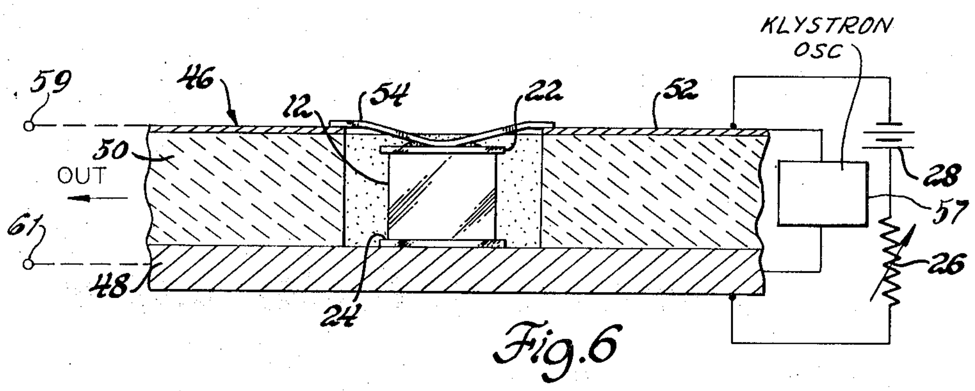
FIG. 6 is a side view in cross section of the preferred physical embodiment of the present invention; and, FIG. 7 is a plan view of the physical embodiment of FIG. 6.
Figure 7:
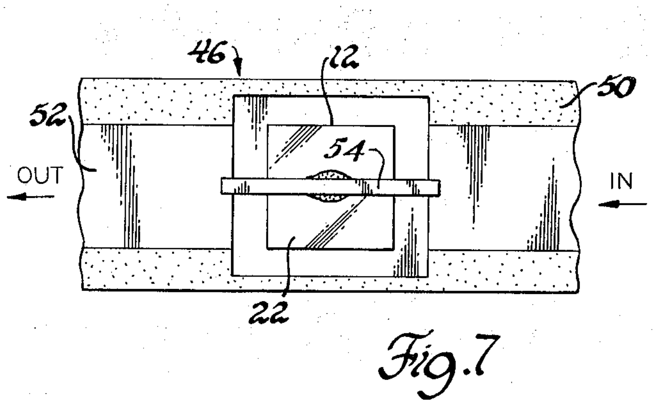

Referring now to FIGS. 6 and 7, the implementation of a microwave frequency pulsed amplifier for accomplishing the objectives of the present invention is illustrated. In the arrangement of FIGS. 6 and 7 a strip transmission line 46 of conventional design is modified to receive in input-output relationship the threshold device 12 so as to permit the impingement of microwave frequency input waveforms 18 on the amorphous body 14 and also to permit the collection and transmission of the amplified microwave frequency output waveform 20. Microwave strip transmission line 46 comprises a ground plane element 48 of conductive material, an intermediate layer 50 of insulative ceramic and a top layer 52 in the form of a narrow conductive strip. The conductive strip 52 and a square section of the ceramic insulative layer 50 are removed down to the level of the ground plane element 48 to receive the threshold device 12 therein. Threshold device 12 is inserted into the square cavity in the transmission line 46 such that the terminal electrode 24 makes contact with and is brazed to the ground plane element 48 and the upper terminal electrode 22 is disposed adjacent the discontinuous portions of the transmission strip 52. A bridging device 54 of conductive material is disposed between the discontinuous portions of the strip 52 so as to make contact with the top terminal electrode 22 of the circuit device 12 as shown in FIGS. 6 and 7. Finally, the dc source 28 and the variable load resistor 26 are connected in series across the strip 52 and the ground plane element 48 for causing the device 12 to operate in the relaxation oscillation mode at a repetition rate determined by the setting of the variable load resistor 26 in accordance with the principles set forth previously herein.

In operation the device of FIGS. 6 and 7 one end connected to a suitable microwave input waveform source such as a Klystron oscillator 57 to produce a relatively low power input waveform in the microwave frequency range and the other end thereof is connected to a pair of output terminals 56–61. This waveform is caused to impinge upon the amorphous body of the threshold device 12 thereby to produce a relatively high energy output pulse train which travels to the left in the microwave strip transmission line of FIGS. 6 and 7. The periodically amplified pulse waveform 20 appears at terminals 59–61 at a pulse repetition rate equal to the inverse of the time between the peaks or spikes 42 of the waveform at A in FIG. 5.

It is to be understood that various implementations of the pulsed amplifier set forth herein may be realized and, thus, the illustrative embodiments given herein are not to be construed as limiting the invention. Moreover, while the theory of explanation given herein is believed to be correct, the operability of the invention is not to be predicted thereon.

The embodiments of the invention in which an exclusive property or privilege is claimed are defined as follows:

1. A pulsed amplifier system for producing spaced pulses of microwave frequency signals comprising in combination: a two terminal threshold type current control device having a pair of load terminals and wherein above a given threshold level the voltage-current characteristic curve thereof has a negative conductivity section between relatively high and low resistance conditions thereof; a source of energizing voltage and a load resistance connected in series with said load terminals, said load resistance providing a load line on said voltage-current characteristic curve which passes through the negative conductivity section thereof to form a self-sustaining relaxation oscillator mode of operation of the current control device where it repeatedly switches between relatively high and low resistance conditions; a source of relatively low power microwave frequency signals persisting during and after the periods when said current control device repeatedly switches between said relatively high and low resistance conditions, the period between successive cycles of the microwave frequency signals being substantially less than the period during which said current control device traverses said negative conductivity section of its voltage-current characteristic curve as it switches between said relatively high and low resistance conditions; and a pair of output terminals across which pulses of said microwave frequency signals are to appear; microwave frequency transmission means having a first section located between the output of said source of relatively low power microwave frequency signals and a second section located between said load terminals of said two terminal threshold type current control device and said pair of output terminals, said first and second sections respectively coupling said source of high frequency signals across said load terminals of said device and extracting power amplified signals therefrom occurring during the cyclic momentary negative conductance mode of operation of said current control device.

2. The amplifier of claim 1 wherein the load resistance is variable to vary the frequency of operation of the relaxation oscillator.

3. The amplifier of claim 1 wherein said current control device comprises said load terminals spaced on a body of a semiconductor material which is amorphous in at least one of said high and low resistance conditions, said semiconductor material being a chalcogenide selected from the group consisting of: sulfur, selenium and tellurium.

4. The amplifier of claim 1 wherein said first and second portions of said microwave frequency transmission means includes first and second spaced conductors for conveying electrical energy in the microwave frequency range from one end to the other thereof, said load terminals of said current control device being disposed at an intermediate point between the ends thereof.

5. The amplifier of claim 4 wherein said signal transmission means is a microwave strip transmission line including a body of insulating material on opposite sides of which said conductors extend, said threshold type current control device being located in a cavity formed in said body of insulating material.

6. The amplifier of claim 5 wherein the strip line comprises a ground plane conductor, an insulator layer on the ground plane conductor, and at least one strip conductor on the insulator layer, the insulator layer being removed at a selected location to define a receptacle for the circuit device, said device being connected between the strip and ground plane conductors.

7. The amplifier defined in claim 1 wherein said current control device comprises said load terminals spaced on a body of a semiconductor material which is amorphous in at least one of said high and low resistance conditions, said semiconductor material being of the type which has current filaments in its conductive state, said current control device supplying a circuit capacitance C, a primary circuit inductance L and a high resistance state resistance $R_0$, the parameters C, L and $R_0$ being selected to satisfy the relationship $\sqrt{LC}/R_0C \leq 1$.

* * * * *